(12) United States Patent
Schneider

(10) Patent No.: US 6,686,618 B2
(45) Date of Patent: Feb. 3, 2004

(54) SEMICONDUCTOR MEMORY HAVING A PLURALITY OF MEMORY-CELL ARRAYS

(75) Inventor: Helmut Schneider, München (DE)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 10/191,855

(22) Filed: Jul. 10, 2002

(65) Prior Publication Data

US 2003/0011021 A1 Jan. 16, 2003

(30) Foreign Application Priority Data

Jul. 13, 2001 (DE) .......................... 101 34 178

(51) Int. Cl.⁷ ....................... H01L 27/108; H01L 29/76; H01L 29/94; H01L 31/119
(52) U.S. Cl. ....................... 257/296; 257/314; 257/315; 257/316; 257/509; 257/544
(58) Field of Search ................. 257/314, 315, 257/316, 509, 544, 296

(56) References Cited

U.S. PATENT DOCUMENTS

| 5,116,777 A | 5/1992 | Chan et al. |
| 5,581,103 A | 12/1996 | Mizukami |
| 6,002,162 A | * 12/1999 | Takahashi et al. .......... 257/544 |

FOREIGN PATENT DOCUMENTS

DE 3424020 A1 1/1985

* cited by examiner

Primary Examiner—Thien Tran
(74) Attorney, Agent, or Firm—Becker & Poliakoff, P.A.; P. E. McQueeney

(57) ABSTRACT

The invention relates to a semiconductor memory (1) having a plurality of memory-cell arrays (2), a plurality of sense-amplifier areas (3) and a plurality of driver areas (4) on a semiconductor substrate (7) of a first conductivity type, each of the multiple sense-amplifier areas (3) and multiple driver areas (4) containing at least one first well (9) of the first conductivity type and/or at least one second well (10) of a second conductivity type, and each first well (9) of the driver areas (4) being isolated from the semiconductor substrate (7) by a buried horizontal layer (8) of the second conductivity type.

In order to ensure less space is required, the semiconductor memory according to the invention exhibits the features that the buried horizontal layer (8) extends continuously beneath at least all the memory-cell arrays (2) and the multiple driver areas (4) of the semiconductor memory (1), and that a separation (6) is provided between the second well (10) and the buried horizontal layer (8) so that the second well (10) is electrically isolated from the buried horizontal layer (8).

20 Claims, 5 Drawing Sheets

SEMICONDUCTOR MEMORY HAVING A PLURALITY OF MEMORY-CELL ARRAYS

Semiconductor memory having a plurality of memory-cell arrays

CROSS REFERENCE TO RELATED APPLICATIONS

This application claims priority under Title 35, United States Code, Section 119(a)–(d) of German application 101 34 178.4 filed Jul. 13, 2001, currently pending.

BACKGROUND OF THE INVENTION

The invention relates to a semiconductor memory having a plurality of memory-cell arrays, a plurality of sense-amplifier areas and a plurality of driver areas on a semiconductor substrate of a first conductivity type, each of the multiple sense-amplifier areas and multiple driver areas containing at least one first well of the first conductivity type and/or at least one second well of a second conductivity type, and each first well of the driver areas being isolated from the semiconductor substrate by a buried horizontal layer of the second conductivity type.

In traditional semiconductor memories having a matrix-like layout of the memory-cell arrays, a driver area (segment driver) and a sense-amplifier area are arranged near each memory-cell array. In order to be able to drive each of the cells independently of the potential of the actual substrate of the semiconductor memory, the cells and their select transistors are isolated from the substrate. This is done by arranging each cell array and each area respectively in its own well. Each well occupies space on the surface of the semiconductor memory, however, so that the total area required for the memory increases.

The object of this invention is to create a semiconductor memory that requires less space.

This object is achieved by a semiconductor memory according to claim 1. Preferred embodiments of the invention are the subject of the dependent claims.

BRIEF SUMMARY OF THE INVENTION

According to the invention, a well is not required for each separate cell array nor for each separate area, and instead of this the buried horizontal layer (cell-array well) extends under the driver areas and preferably the sense-amplifier areas. In order to avoid one of the wells of the driver transistors affecting the buried layer, the wells have a flatter design, indeed so flat that no electrical contact is made with the buried layer.

The development according to the invention of the semiconductor memory of this type is characterized in that the buried horizontal layer extends continuously beneath at least all the memory-cell arrays and the multiple driver areas of the semiconductor memory, and the second well is separated from the buried horizontal layer so that the second well is electrically isolated from the buried horizontal layer.

In particular, the buried horizontal layer extends continuously beneath all cells, including beneath the multiple sense-amplifier areas of the semiconductor memory.

In a preferred embodiment, transistors of the first conductivity type are arranged in the second well at the edge of the semiconductor memory.

In a preferred embodiment, at least one electrical circuit is arranged in the buried horizontal layer at the edge of the semiconductor memory, the electrical circuit, of which there is at least one, having a raised supply voltage or a reduced reference potential.

An advantage of the invention is that any increased production costs that might arise are more than compensated for by the gain in chip area.

Further features and advantages of the invention arise from the following description of exemplary embodiments with reference to the attached drawings.

DETAILED DESCRIPTION

Figure 1:
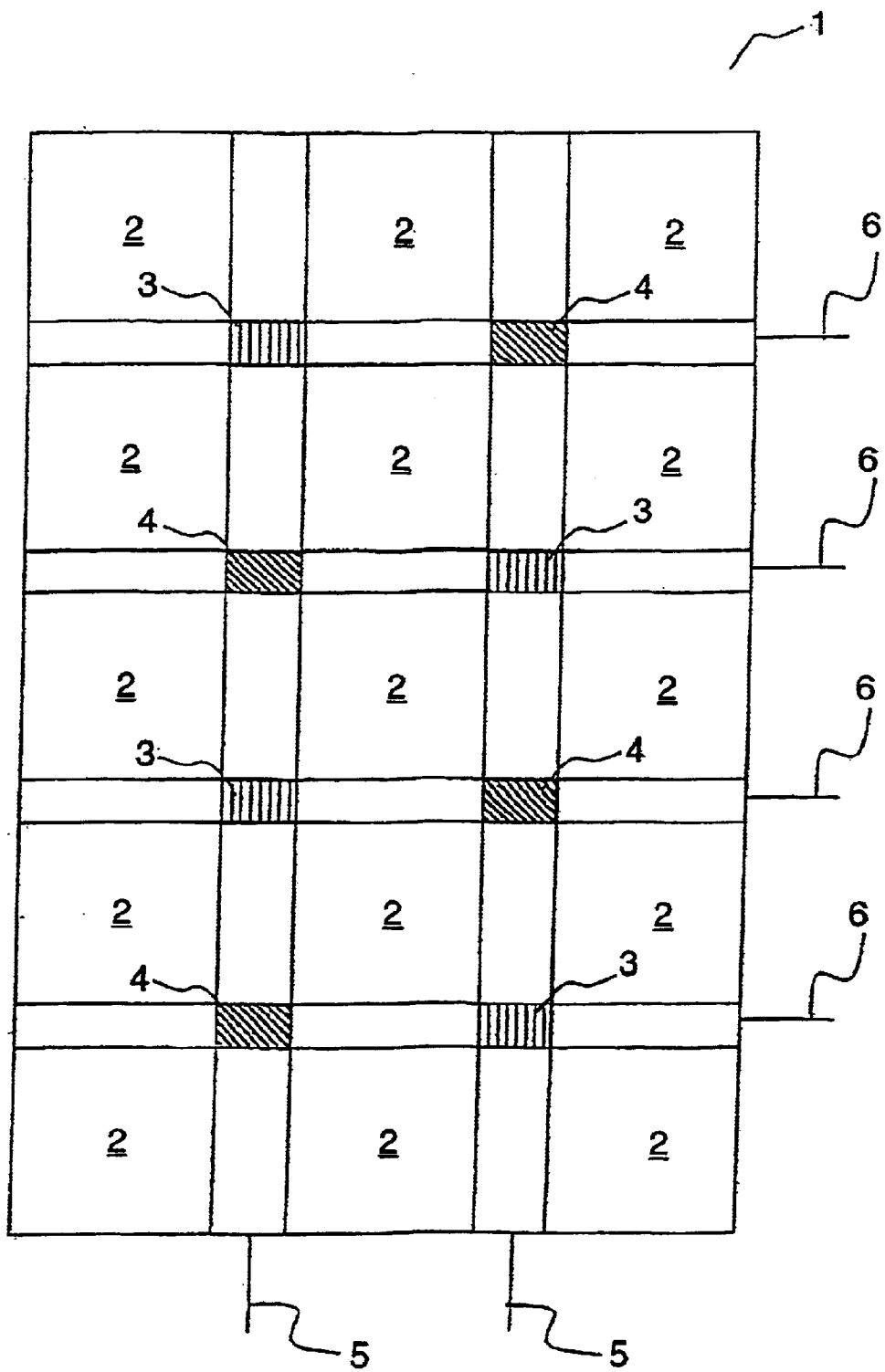
FIG. 1 shows schematically a semiconductor memory according to the state of the art having a matrix-type arrangement of memory-cell arrays.

FIG. 1 shows the matrix-type arrangement of the cell arrays of a semiconductor memory 1. Areas containing densely packed independent memory cells (memory-cell arrays) are labeled 2, the sense-amplifier areas are labeled 3, and the driver areas for the memory-cell arrays 2 are labeled 4. Word lines 5 and bit lines 6, which can be used to read the contents of each individual memory cell 2 or to write to each individual memory cell 2 are taken out laterally from the semiconductor memory 1.

Figure 2A:
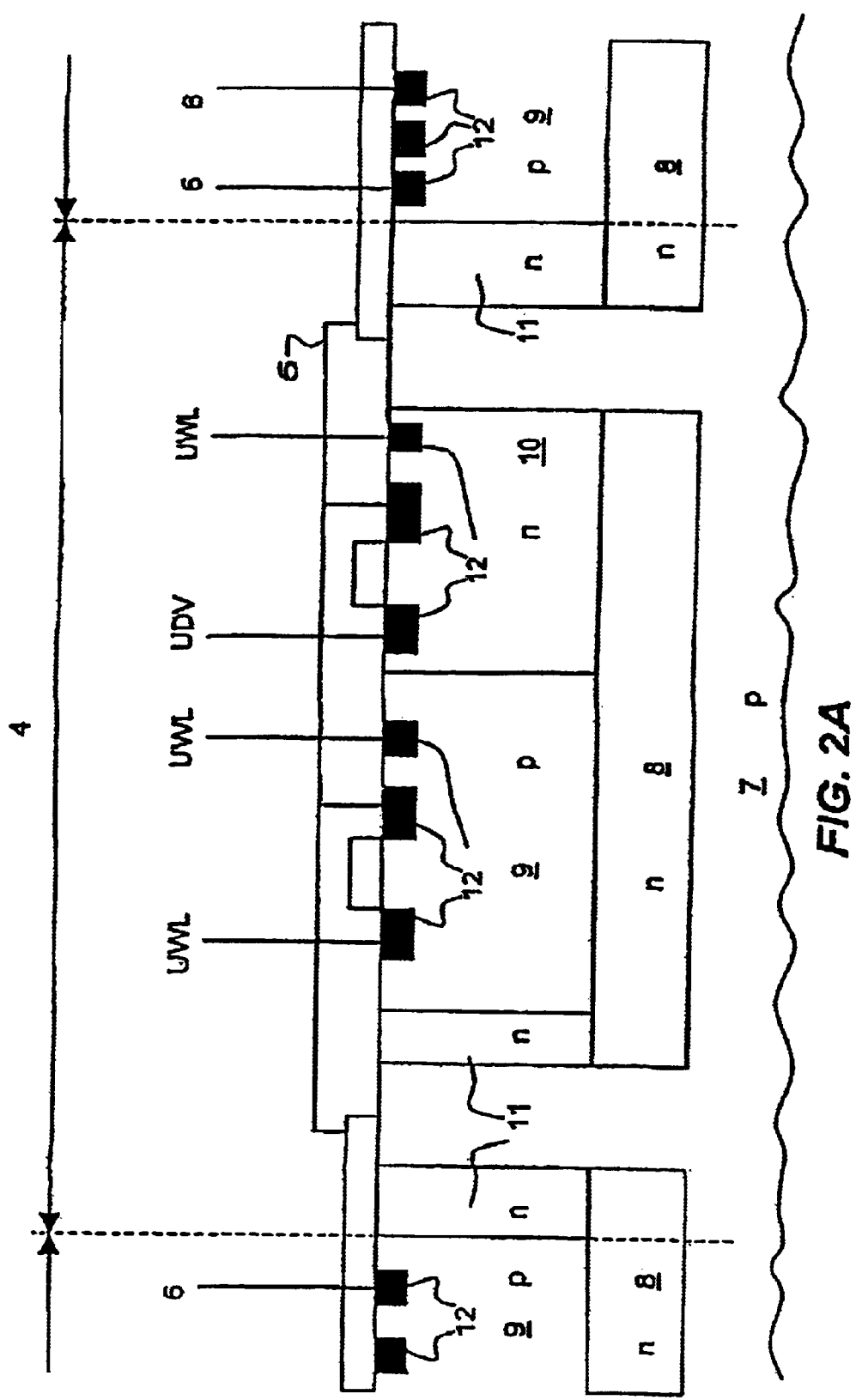
FIGS. 2A and 2B show a cross-section through a driver cell and a sense amplifier respectively according to the state of the art.
Figure 2B:
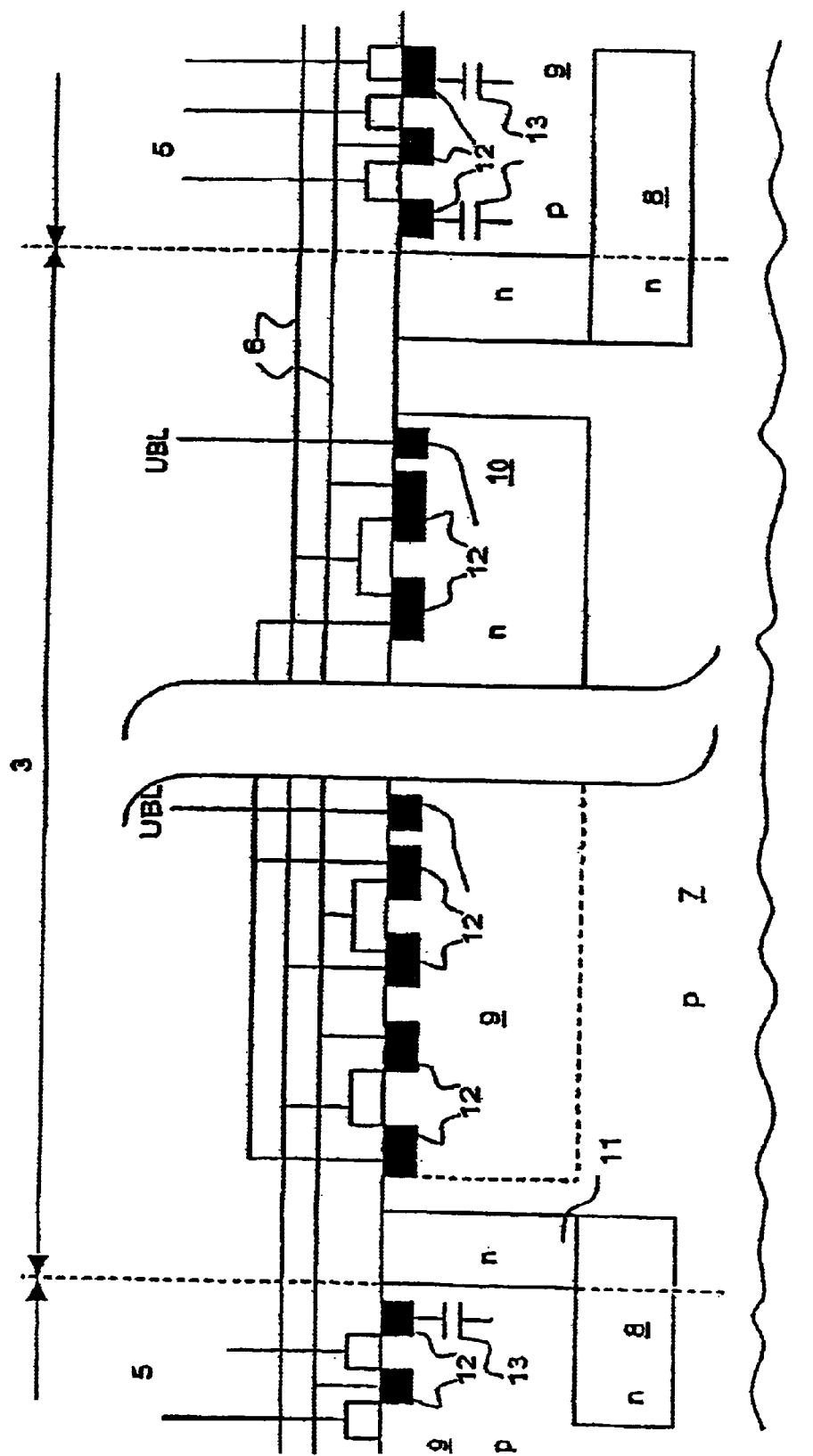

FIGS. 2A and 2B show in cross-section the detailed structure of a driver cell 4 and a sense-amplifier 3 respectively according to the state of the art.

The driver cell 4 according to the state of the art shown in FIG. 2A is fabricated on a substrate 7 and arranged between two memory-cell arrays, parts of which are shown on the left and right edge of FIG. 2A. In the illustrated embodiment the substrate 7 is of type p. The memory-cell arrays contain, on a horizontal buried layer 8 that isolates the memory cell 2 from the underlying substrate 7, a first well of the first conductivity type, so in this case of type p. The driver cell 4 between the memory-cell arrays 2 normally contains a plurality of p- and n-doped wells, of which a first well 9 of type p and a second well 10 of type n are shown. The first well 9 is therefore of the same conductivity type as the substrate 7. In order to electrically isolate the first well 9 from the substrate 7, like the memory cell 2 it is isolated from the substrate 7 by a buried horizontal layer 8. Both memory cell 2 and driver cell 4 are also isolated laterally from the surrounding p-doped material by a vertical area 11. The buried horizontal layer 8 and the vertical area 11 are both of the second conductivity type, so in this case of type n. The electrodes 12 on the surface of the semiconductor are used to drive the transistors fabricated in the wells or to apply a supply voltage, labeled in the figures as UWL/UBL or UDV, to the transistors.

The extent of such a driver cell 4 according to the state of the art is indicated in FIG. 2A by two vertical dashed lines and a double arrow running between them above the cell. For reasons which will become apparent later, the two vertical areas 11 that belong to the adjacent memory-cell arrays 2 have been included in the driver cell 4 in this figure.

FIG. 2B shows a sense amplifier 3 according to the state of the art. Like the driver cells, the sense amplifier 3 contains a plurality of p- and n- wells, of which a first p -well 9 and a second n- well 10 are shown in FIG. 2B. In other respects the elements in FIG. 2B correspond to those in FIG. 2A, and have the same labeling. Contrary to the driver cell 4 in FIG. 2A, however, it is not necessary to isolate the wells from the substrate 7 in the case of the sense amplifier 3 in FIG. 2B. Thus, in the state of the art, the horizontal buried layer 8 is not normally present beneath the sense amplifier 3. The p- well 9, which would need to be isolated, is indicated dashed in FIG. 2B.

The inventor has established that it is not necessary to "individually" isolate each p- well 9 from the substrate 7, as required in the state of the art described above, but if all cells in the memory chip are isolated jointly from the substrate by a buried horizontal layer, then not only can space be gained on the wafer but also fabrication of the memory chips can be made far more efficient. To do this, however, the buried horizontal layer must be independent of the overlying respective n- well 10. This means that a separation must be maintained between the n- well 10 and the buried horizontal layer 8.

Figure 3A:
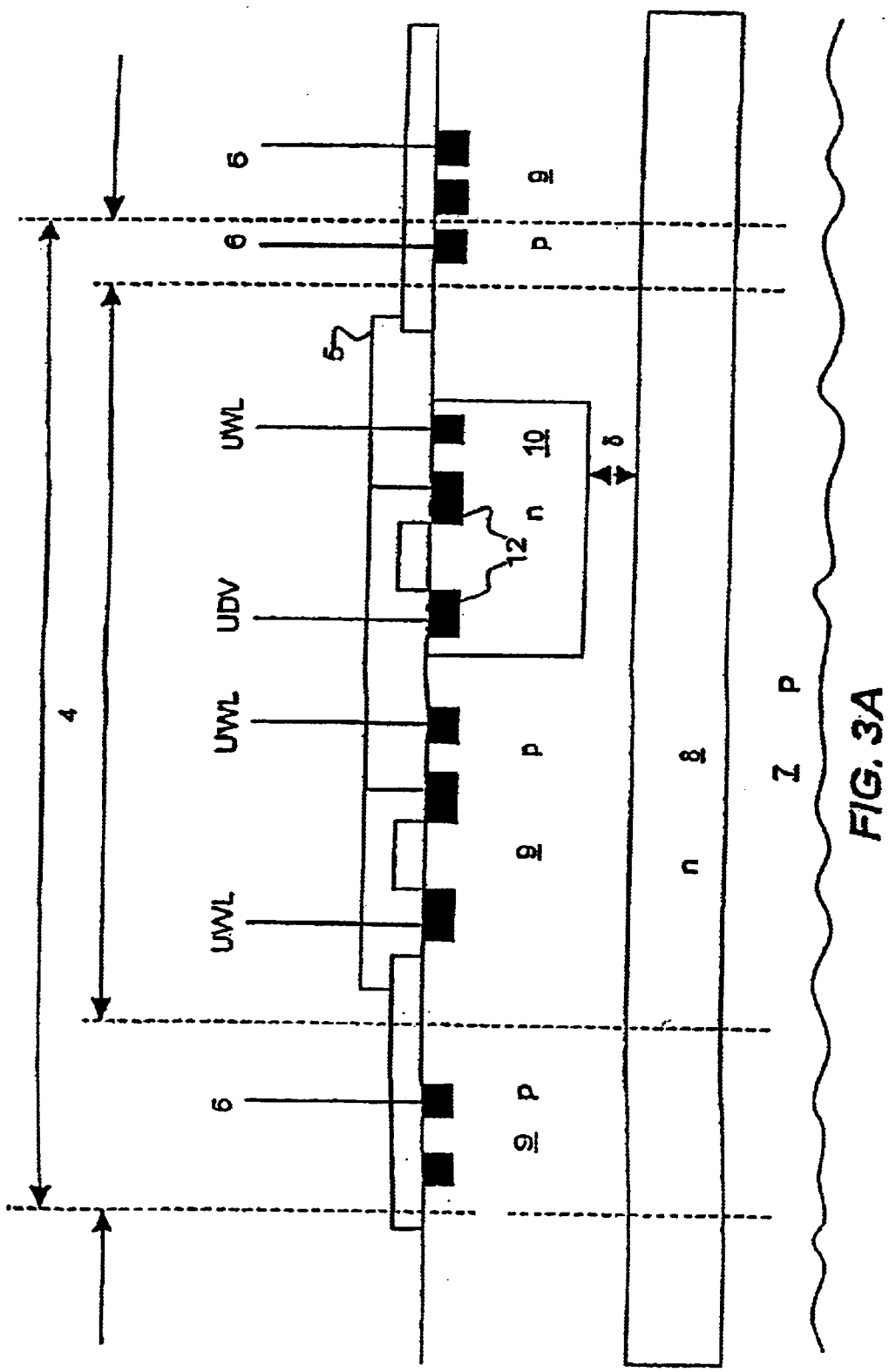
FIGS. 3A and 3B show a cross-section through a driver cell according to the invention and through a sense amplifier according to the invention respectively.
Figure 3B:
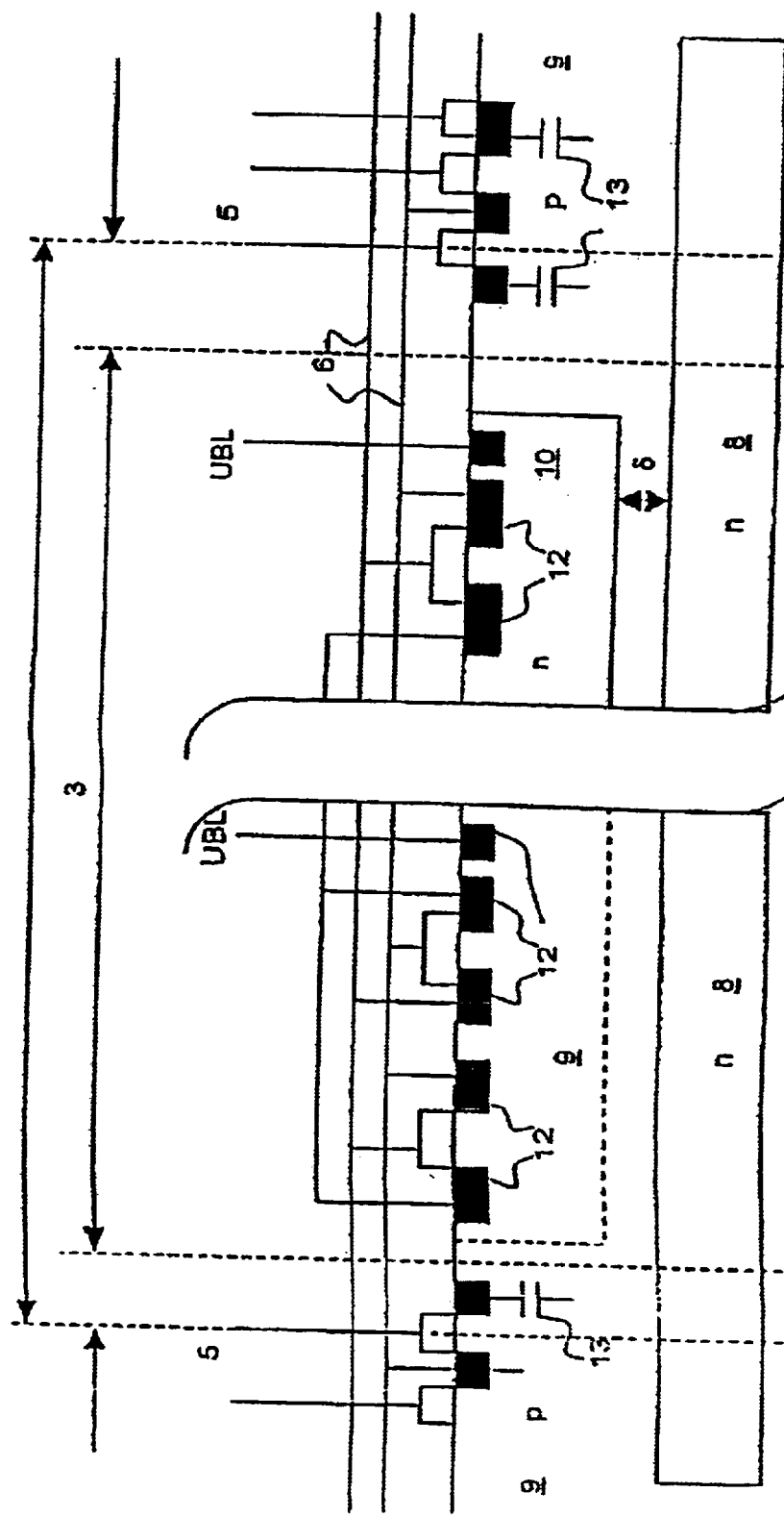

The sense amplifier 3 and the driver cell 4 of the semiconductor memory 1 according to the invention having the layout shown in FIG. 1, are shown in cross-section in FIGS. 3A and 3B. Here, in order to illustrate the space gained by the invention, the dimensions of the cell according to the invention compared with the traditional cell are indicated respectively by two double arrows drawn along the top. The space gained for both cell types results from the removal of the vertical areas 11, which are in fact lost from both the driver cell 4 and from each memory cell 2 (this is why the vertical area 11 of the memory cell 2 has also been included in the extent of the driver cell above).

The driver cell 4 shown in FIG. 3A has exactly the same structure in terms of the wells 9 and 10 and their electrodes 12 as the driver cell 4 in FIG. 2A. In the illustrated embodiment of the driver cell according to the invention, however, the vertical side areas 11 are missing. Instead the buried horizontal layer 8 is extended so that it continues beyond the driver cell 4 to beneath the adjacent memory-cell arrays 2 of the semiconductor memory 1.

In order to avoid any unwanted influence on the buried horizontal layer 8 by one of the wells 10 of the same conductivity type, a separation δ is maintained between every second well 10 and the buried horizontal layer 8, so that the second well 10 is electrically isolated from the buried horizontal layer 8. The maintained separation δ is indicated in FIGS. 3A and 3B by a vertical double arrow.

In the same way as in the driver cell 4, the buried horizontal layer 8 also extends beneath the sense-amplifier areas 3 in a preferred embodiment of the invention shown in FIG. 3B. In this preferred embodiment, the overall result is therefore a continuous horizontal layer 8 running beneath all cells of the semiconductor memory 1.

The space gained in this design compared with the state of the art is so great that the flat N- well 10 according to the invention can be used for the fabrication of P-channel transistors at its edge.

In addition, the buried layer 8 still required for cell-array isolation enables whole circuit areas to be shifted into a well at the edge of the semiconductor memory 1. This is particularly advantageous in generators and circuit areas having a raised supply voltage or derived reference voltage.

I claim:
1. Semiconductor memory (1) comprising
a. a plurality of memory-cell arrays (2);
b. a plurality of sense-amplifier areas (3); and
c. a plurality of driver areas (4) on a semiconductor substrate (7) of a first conductivity type,
each of the multiple sense-amplifier areas (3) and multiple driver areas (4) containing at least one first well (9) of the first conductivity type and/or at least one second well (10) of a second conductivity type,
and each first well (9) of the driver areas (4) being isolated from the semiconductor substrate (7) by a buried horizontal layer (8) of the second conductivity type,
characterized in that the buried horizontal layer (8) extends continuously beneath at least all the memory-cell arrays (2) and the multiple driver areas (4) of the semiconductor memory (1), and the second well (10) is separated from the buried horizontal layer (8) so that the second well (10) is electrically isolated from the buried horizontal layer (8).
2. Semiconductor memory according to claim 1, characterized in that at least one electrical circuit is arranged in the buried horizontal layer (8) at the edge of the semiconductor memory (1).
3. Semiconductor memory according to claim 2, characterized in that the electrical circuit, of which there is at least one, has a reduced reference potential.
4. Semiconductor memory according to claim 2, characterized in that the electrical circuit, of which there is at least one, has a raised supply voltage.
5. Semiconductor memory according to claim 4, characterized in that the electrical circuit, of which there is at least one, has a reduced reference potential.
6. Semiconductor memory according to claim 1 characterized in that transistors of the first conductivity type are arranged in the second well (10) at the edge of the semiconductor memory.
7. Semiconductor memory according to claim 6, characterized in that at least one electrical circuit is arranged in the buried horizontal layer (8) at the edge of the semiconductor memory (1).
8. Semiconductor memory according to claim 7, characterized in that the electrical circuit, of which there is at least one, has a reduced reference potential.
9. Semiconductor memory according to claim 7, characterized in that the electrical circuit, of which there is at least one, has a raised supply voltage.
10. Semiconductor memory according to claim 9, characterized in that the electrical circuit, of which there is at least one, has a reduced reference potential.
11. Semiconductor memory according to claim 1, characterized in that the buried horizontal layer (8) extends continuously beneath said plurality of memory-cell arrays (2), said plurality of sense-amplifier areas (3), and said plurality of driver areas (4) of the semiconductor memory (1).
12. Semiconductor memory according to claim 11, characterized in that at least one electrical circuit is arranged in the buried horizontal layer (8) at the edge of the semiconductor memory (1).
13. Semiconductor memory according to claim 12, characterized in that the electrical circuit, of which there is at least one, has a reduced reference potential.
14. Semiconductor memory according to claim 12, characterized in that the electrical circuit, of which there is at least one, has a raised supply voltage.

15. Semiconductor memory according to claim 14, characterized in that the electrical circuit, of which there is at least one, has a reduced reference potential.

16. Semiconductor memory according to claim 11 characterized in that transistors of the first conductivity type are arranged in the second well (10) at the edge of the semiconductor memory.

17. Semiconductor memory according to claim 16, characterized in that at least one electrical circuit is arranged in the buried horizontal layer (8) at the edge of the semiconductor memory (1).

18. Semiconductor memory according to claim 17, characterized in that the electrical circuit, of which there is at least one, has a reduced reference potential.

19. Semiconductor memory according to claim 17, characterized in that the electrical circuit, of which there is at least one, has a raised supply voltage.

20. Semiconductor memory according to claim 19, characterized in that the electrical circuit, of which there is at least one, has a reduced reference potential.

\* \* \* \* \*